United States Patent [19]

Jonath

[11] 4,242,677
[45] Dec. 30, 1980

[54] MONITORING DEVICE AND METHOD FOR A MULTIPLEXED SEGMENTAL DISPLAY

[75] Inventor: Eberhard Jonath, Volketswil, Switzerland

[73] Assignee: Mettler Instrumente AG, Greifensee-Zurich, Switzerland

[21] Appl. No.: 42,249

[22] Filed: May 24, 1979

[51] Int. Cl.³ .............................................. G09F 9/32
[52] U.S. Cl. .................................. 340/715; 340/652; 340/765; 340/802
[58] Field of Search ............... 340/715, 642, 652, 641, 340/765, 753, 754, 802

[56] References Cited

U.S. PATENT DOCUMENTS

| | | | |
|---|---|---|---|
| 3,719,937 | 3/1973 | Doyle | 340/715 |
| 3,813,664 | 5/1974 | Geyer | 340/715 |
| 3,866,171 | 2/1975 | Loshbough | 340/715 |
| 3,943,500 | 3/1976 | Buchanan | 340/642 |
| 3,975,726 | 8/1976 | Kawakami | 340/802 |

*Primary Examiner*—Marshall M. Curtis
*Attorney, Agent, or Firm*—Marianne Rich

[57] ABSTRACT

A monitoring unit also using a multiplicity of segments having a common electrode and each having an individual electrode is connected to the display units and the multiplexer constituting the display so that its common electrode is energized in sequence with the common electrodes of the display units and each of its individual electrodes forms the last of a series connected set of corresponding electrodes in all display units. All electrode sets are energized when the common electrode of the monitoring unit is energized, so that failure of a monitoring segment to light indicates failure of at least one electrode in the electrode set.

8 Claims, 3 Drawing Figures

MONITORING DEVICE AND METHOD FOR A MULTIPLEXED SEGMENTAL DISPLAY

The present invention relates to displays having a plurality of display units each utilizing a multiplicity of segments. More particularly, it relates to methods and devices for monitoring such displays when these displays are driven by a multiplexer.

BACKGROUND AND PRIOR ART:

A monitoring system for a segmental type display is disclosed in DE-OS No. 27 12 398. In the system disclosed therein, a comparator is provided for each line energizing one of the segments. A similar system, requiring a diode for each energizing lead is disclosed in U.S. Pat. No. 3,943,500, which is hereby incorporated by reference into this application. This type of monitoring circuit requires much extra equipment and is further useful only for displays in which a sufficient amount of current flows in the energizing leads (e.g. displays utilizing light-emitting diodes).

A system disclosed in DE-OS No. 24 06 093 illustrates a segmental display in which corresponding segment electrodes in the various display units are connected in series to form an electrode set. However, no monitoring system or method is disclosed in this reference.

SUMMARY OF THE INVENTION:

It is an object of the present invention to furnish a monitoring system and method which is applicable to all segmental type of displays which are driven in a multiplex mode. It is a further object of the present invention to reduce the extra equipment required for the monitoring system to a minimum and to create a monitoring system and method which are particularly useful for displaying the weight measured by a scale.

The monitoring system of the present invention monitors a plurality of display units each having a multiplicity of segments, first connecting means being furnished to connect the electrodes of corresponding segments in each unit in series with each other. Energizing means energize the so-formed electrode sets in accordance with the symbol to be displayed, while a multiplexer energizes the common electrodes of the units in a sequence synchronized to the energization of the electrode sets. The monitoring system of the present invention comprises a monitoring unit having a multiplicity of segments having a common electrode and each segment further having an individual electrode. The individual monitoring electrodes are connected to form the last of the electrode sets formed by the individual electrodes in the display units. The common electrode of the monitoring unit is energized by the multiplexer in sequence with the display units. Preferably, the energizing means energize all electrode sets when the common electrode of the monitoring unit is being energized, so that failure of a monitoring segment to light indicates failure of at least one electrode in the electrode set.

When the display is to be used in a scale, where only numerical values and a decimal point are required, it is sufficient to monitor only five segments, that is specifically those segments whose failure to light would not be recognizable as such but would indicate an incorrect number. For other types of display, it may be required to monitor all segments in the display units. For some applications it may also be desirable to furnish an alarm signal upon failure of one of the monitoring segments to light.

Monitoring segments may also be provided to monitor symbols other than numbers in the display as, for example, signs, or symbols indicating the unit of measurement. The number of segments provided in the monitoring unit may therefore be less than, greater than or equal to the number of segments in each display unit.

Depending upon the application, the monitoring unit may be visible to the operator of the device or may be covered from view. If it is visible, the monitoring segments can be arranged to form, for example, a circle, thereby making an unlit segment very easy to detect. If the monitoring unit is covered from view, one or more photo cells may be provided to monitor the output of the monitoring segments and furnish an alarm signal in the event that one of the monitoring segments remains unlit.

The novel features which are considered as characteristic for the invention are set forth in particular in the appended claims. The invention itself, however, both as to its construction and its method of operation, together with additional objects and advantages thereof will best be understood from the following description of specific embodiments when read in connection with the accompanying drawing.

To illustrate the invention, a seven-segment display utilizing liquid crystals and used for displaying the weight on a scale has been selected. For purpose of clarity, only three display units are shown, but this is exemplary only and the invention can readily be expanded to include displays having any number of display units. It should, as a matter of fact, be noted that the monitoring method and device disclosed herein are independent of the number of units in the display, so that the greater the number of units, the less the relative additional cost incurred by provision of the monitoring unit.

Figure 1:
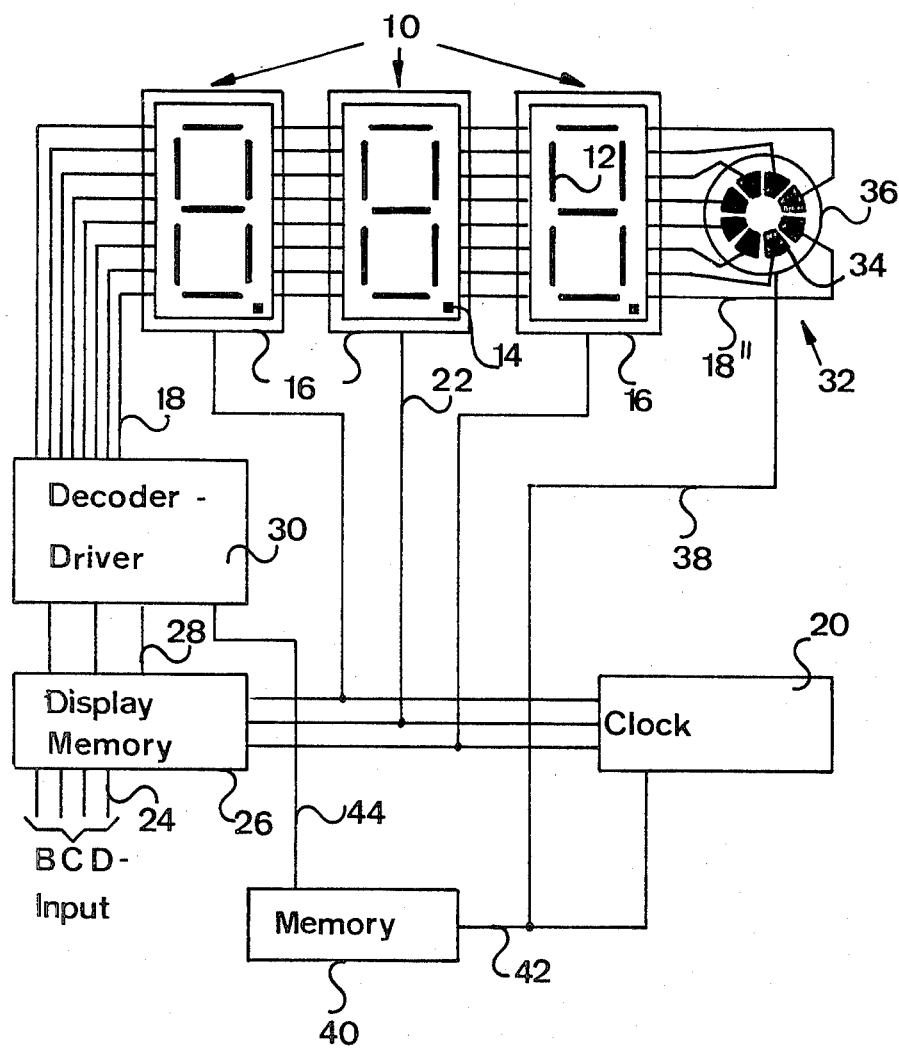
FIG. 1 is a schematic diagram showing a display having three display units and a monitoring unit.
Figure 2:
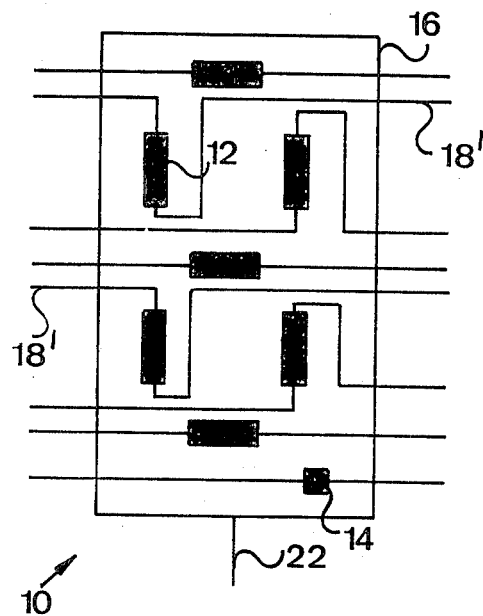
FIG. 2 is a more detailed diagram of one of the display units of FIG. 1.

As shown in FIG. 1, each display unit 10 comprises seven individual electrodes 12 vaporized onto a substrate. A common electrode 16, physically located in the plane behind the plane of the paper, is provided for each display unit 10. The individual electrodes of corresponding segments in each display unit are connected in series with each other by leads 18'. Multiplexing of the units is controlled by a clock and counter circuit 20. The output of circuit 20 causes the common electrodes 16 of display units 10 to be energized in a predetermined sequence via lines 22. The same outputs of circuit 20 also address memory locations in a display memory 26. Memory 26 receives binary coded decimal inputs on lines 24 which signify the symbols to be displayed. The output of memory 26 is connected through lines 28 to the inputs of a decoder-driver 30. The output lines 18 of decoder-driver 30 are herein referred to as energizing lines and are connected to the beginnings of the electrode sets formed by the individual electrodes as interconnected by lines 18'. Energization takes place by means of AC voltages, that is segments to be lit receive an AC voltage at the individual electrode which is opposite in phase to the voltage applied to the common electrode, while segments which are to remain dark receive an AC voltage which is in phase with the latter. This type of display is well known and will not be described in detail here.

Monitoring unit 32 is provided in accordance with the present invention. Monitoring unit 32 includes eight individual electrodes 34 which are arranged in a symmetrical pattern, that is as shown in FIG. 1 in a circular form. Each segment 34 is connected to the end of one of the above-described electrode sets through a line 18", the eighth segment being connected to an electrode set formed by the decimal points 14. The monitoring unit has a common electrode 36 which is energized through a line 38 by circuit 20. An additional memory 40 is connected to an additional output line 42 of circuit 20. The output of additional memory 40 is connected through a line 44 to decoder-driver 30. Signals stored in memory 40 signify that all electrode sets are to be energized via lines 18. While memory 40 is shown as a separate memory, it may in practice be simply an additional memory location in display memory 26.

In operation, each display unit 10 is energized in sequence, the common electrodes 16 being energized in synchronism with the energization of lines 18 to provide the desired visual output. However, the multiplexer, namely clock and counter 20, is now arranged to furnish an additional signal in each cycle, namely a signal for energizing common electrode 34 of monitoring unit 32 so and, simultaneously, energizing all lines 18 so that, if all electrodes of display units 10 are properly operative, all segments of the monitoring unit will be lit. Any defect in one of the energizing lines 18, one of the interconnecting lines 18' or any one of the individual electrodes of display units 10 will result in a lack of output of the corresponding segment in the monitoring unit. This can then be immediately observed by the operator.

Figure 3:
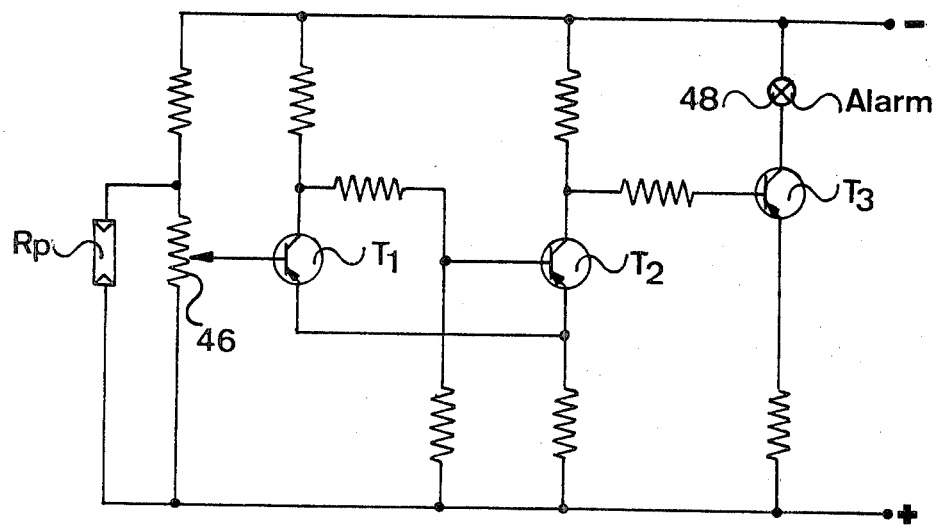
FIG. 3 is a circuit diagram of an alarm generating circuit.

If a visual control by the operator is not desirable, the monitoring unit 32 may be covered and a photoelectric scanning of the monitoring unit provided so that failure of a monitoring segment to light causes an alarm signal to be furnished. A scanning circuit is illustrated in FIG. 3. As shown in FIG. 3, a transistor T1 and a transistor T2 are arranged in a Schmitt trigger configuration. The base of transistor T1 is connected to the variable arm of a potentiometer 46. A photo resistor $R_p$ is connected in parallel with potentiometer 46. The collector of transistor T2 is resistively connected to the base of a transistor T3. The emitter-collector circuit of transistor T3 is connected in series with an alarm generating device 48 which, in a preferred embodiment, is a lamp.

The above-described circuit operates as follows: potentiometer 46 is so adjusted that, when full illumination is received by photo resistor $R_p$, the voltage applied to the base of transistor T1 causes transistor T1 to block. Transistor T2 is conductive, causing a blocking voltage to be applied to the base of transistor T3. Alarm generating device 48 remains deenergized. If now the resistance of resistor $R_p$ increases due to a decrease in illumination, the voltage applied to the base of transistor T1 becomes more negative. Transistor T1 conducts, causing transistor T2 to block. The voltage applied to the base of transistor T3 is then sufficiently negative to cause transistor T3 to become conductive. Alarm generating device 48 is energized, that is if it is a lamp, lamp 48 is lit. Depending upon the arrangement and/or light emitted by the individual segments of monitoring unit 32, photo resistor $R_p$ may comprise a single photo resistor or a plurality thereof.

Physically, the monitoring unit 32 may be arranged at either end of the display or, if longer connecting leads can be tolerated, the monitoring unit may be physically located away from the display.

While the invention has been illustrated in preferred embodiments, it is not to be limited to the circuits and structures shown, since many variations thereof will be evident to one skilled in the art and are intended to be encompassed in the present invention as set forth in the following claims.

I claim:

1. In a display having a plurality of display units each having a multiplicity of display segments having a common electrode, each of said display segments further having an individual electrode, said display means further having first connecting means for connecting corresponding ones of said individual electrodes in said display units to each other thereby forming electrode sets, energizing means having a plurality of energizing lines each connected to one of said electrode sets for energizing said electrode sets in accordance with the symbol to be displayed under control of read-out signals, and multiplexer means connected to said common electrodes and said energizing means for energizing said common electrodes in a predetermined sequence and for applying corresponding read-out signals to said energizing means:

a monitoring system comprising
a monitoring unit having a plurality of monitoring segments having a common electrode, each of said monitoring segments further having an individual electrode;
second connecting means for connecting each of said individual electrodes of said monitoring segments to one of said electrode sets, thereby forming a plurality of extended electrode sets;
means in said multiplexer means for extending said predetermined sequence to include said common electrode of said monitoring unit thereby creating an extended sequence; and
additional means connected to said energizing means for applying a test signal energizing all of said extended electrode sets to said extended electrode sets during energization of said common electrode of said monitoring unit, thereby energizing all of said monitoring segments only if all of said individual electrodes forming said electrode sets are in operative condition.

2. A display as set forth in claim 1, wherein said first connecting means comprises means for connecting said corresponding ones of said individual electrodes in said display units in series to each other.

3. A display as set forth in claim 1, wherein said energizing means comprises display memory means having a plurality of display memory locations addressable by said read-out signals, each for storing energizing signals indicative of a symbol to be displayed in one of said display units;
wherein said additional means comprises additional memory means for storing said test signal;
wherein said multiplexer means comprises ring counter means for furnishing a plurality of counting signals each for energizing one of said common electrodes and for addressing the corresponding one of said display memory locations;
and wherein said means in said multiplexer means comprises means for furnishing a monitoring counting signal for addressing said additional memory means and for substantially simultaneously energizing said common electrode of said monitoring unit.

4. A display as set forth in claim 3, wherein said monitoring segments form a visible predetermined pattern when all of said individual electrodes forming said extended electrode sets are in operative condition, whereby defects in said pattern indicate inoperative electrode sets.

5. A display as set forth in claim 3, further comprising shielding means for shielding said monitoring unit from view, and means for furnishing an alarm signal in response to continuous lack of energization of any one of said monitoring segments.

6. A display as set forth in claim 5, wherein said alarm signal furnishing means comprises at least one photocell mounted to receive light from said monitoring segments, and circuit means connected to said at least one photocell for furnishing said alarm signal in response to a predetermined decrease of incident illumination on said photocell.

7. In a display system having a plurality of display units energized in a predetermined sequence at energizing time instants for effecting a display, each of said display units having a multiplicity of display segments each having at least one individual electrode, said display means further having connecting means for connecting corresponding ones of said individual electrodes in each of said display units in series thereby forming a plurality of electrode sets each having a beginning and an end, apparatus for monitoring said electrode sets, comprising means for periodically applying test signals to said beginnings of at least selected ones of said electrode sets at monitoring time instants not coinciding with said energizing time instants, whereby an end signal appears at said ends of said selected ones of said electrode sets at said monitoring time instants only if said individual electrodes constituting said electrode set are in operative condition;

means for creating a timing signal at each of said monitoring time instants;

and monitoring circuit means connected to said ends of said selected ones of said electrode sets for creating individual monitoring signals each only in response to the simultaneous presence of one of said end signals and said timing signal, whereby the absence of one of said individual monitoring signals is indicative of an inoperative electrode set.

8. In a display system having a plurality of display units each having a multiplicity of display segments having a common electrode, each of said display segments further having an individual electrode, said display means further having connecting means for connecting corresponding ones of said individual electrodes in said display units in series thereby forming a multiplicity of electrode sets, each having a beginning and an end, energizing means including a multiplicity of energizing lines each connected to one of said beginnings of said electrode sets for energizing said electrode sets in accordance with the symbol to be displayed under control of read-out signals, and multiplexer means connected to said energizing means and said common electrodes for energizing said common electrodes in a predetermined sequence at energizing time instants and for furnishing said read-out signals in an energizing sequence corresponding to said predetermined sequence:

a method for monitoring said display system, comprising the steps of periodically applying test signals to said beginnings of at least selected ones of said electrode sets at monitoring time instants not coincident with said energizing time instants whereby an end signal appears at said end of any one of said selected ones of said electrode sets at said monitoring time instants only if the individual electrodes constituting said electrode set are in operative condition;

creating a timing signal at each of said monitoring time instants; and creating an individual monitoring signal in response to joint presence of said timing signal and one of said end signals, whereby each of said individual monitoring signals is indicative of an operative electrode set.

* * * * *